(12) United States Patent
Uemura et al.

(10) Patent No.: US 8,072,251 B2
(45) Date of Patent: Dec. 6, 2011

(54) LATCH CIRCUIT AND ELECTRONIC DEVICE

(75) Inventors: Taiki Uemura, Kawasaki (JP); Yoshiharu Tosaka, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 94 days.

(21) Appl. No.: 12/388,689

(22) Filed: Feb. 19, 2009

(65) Prior Publication Data

US 2009/0243686 A1 Oct. 1, 2009

(30) Foreign Application Priority Data

Mar. 26, 2008 (JP) .................................. 2008-079832

(51) Int. Cl.
*H03K 3/00* (2006.01)

(52) U.S. Cl. ........................................ 327/199; 327/185

(58) Field of Classification Search .................. 327/199, 327/200–204, 185, 207–214, 223–227
See application file for complete search history.

(56) References Cited

U.S. PATENT DOCUMENTS

| 2007/0226600 | A1 | 9/2007 | Ogawa |
| 2007/0268054 | A1 | 11/2007 | Uemura et al. |
| 2007/0268055 | A1* | 11/2007 | Mo ................................ 327/218 |
| 2009/0140764 | A1* | 6/2009 | Uemura et al. .................. 326/9 |

FOREIGN PATENT DOCUMENTS

| JP | 2007-248378 A | 9/2007 |
| JP | 2007-312104 A | 11/2007 |

* cited by examiner

*Primary Examiner* — Lincoln Donovan
*Assistant Examiner* — Diana J Cheng
(74) *Attorney, Agent, or Firm* — Arent Fox LLP

(57) ABSTRACT

A latch circuit includes: four or more gates; three input terminals and one or two output terminals which are connected to at least one of the four or more gates; a feedback circuit in which respective input terminals of the four or more gates are connected to output terminals of at least another two of the four gates; and a data inverting gate which, when all data input into the three input terminals is the same, outputs inverted data of the data from the output terminals, and when all the data input into the three input terminals is not the same, retains previous data.

14 Claims, 11 Drawing Sheets

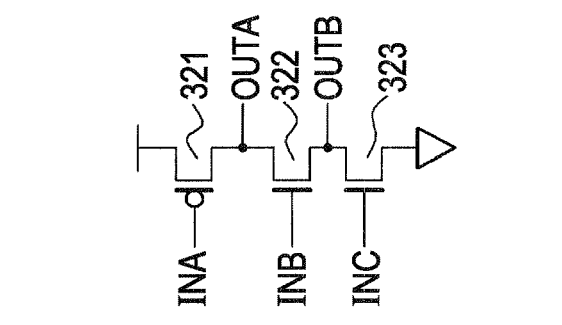
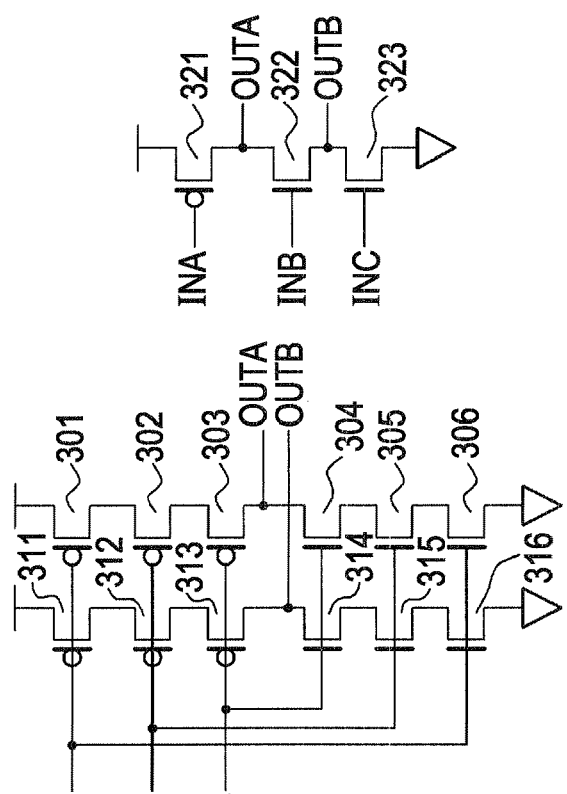
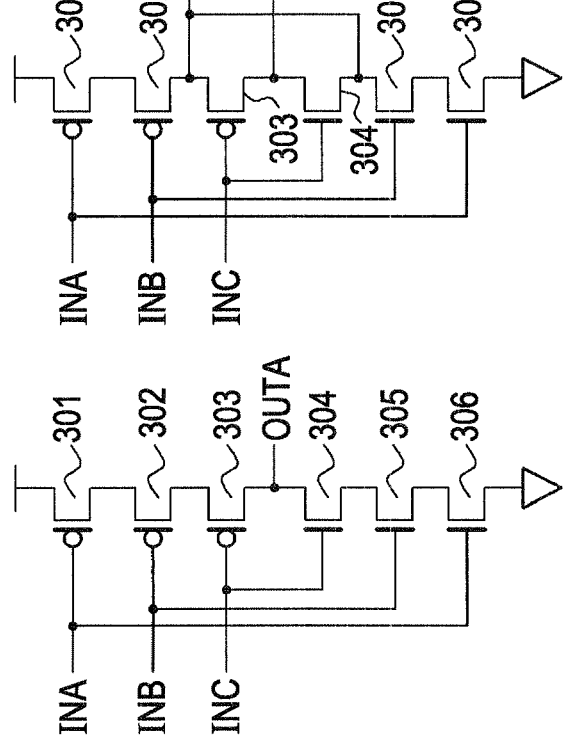
FIG. 3A  FIG. 3B  FIG. 3C  FIG. 3D

FIG. 4

| INA | INB | INC | OUTA |
|---|---|---|---|
| 0 | 0 | 0 | 1 |
| 0 | 0 | 1 | RETAIN PREVIOUS DATA |
| 0 | 1 | 0 | |
| 0 | 1 | 1 | |
| 1 | 0 | 0 | |
| 1 | 0 | 1 | |
| 1 | 1 | 0 | |
| 1 | 1 | 1 | 0 |

FIG. 5

| INA | INB | INC | OUTA | OUTB |
|---|---|---|---|---|
| 0 | 0 | 0 | 1 | 1 |
| 0 | 0 | 1 | 1 | X |
| 0 | 1 | 0 | X | X |
| 0 | 1 | 1 | X | X |
| 1 | 0 | 0 | X | X |
| 1 | 0 | 1 | X | X |
| 1 | 1 | 0 | 0 | X |
| 1 | 1 | 1 | 0 | 0 |

LATCH CIRCUIT AND ELECTRONIC DEVICE

CROSS-REFERENCE TO RELATED APPLICATION

This application is based upon and claims the benefit of priority from prior Japanese Patent Application No. 2008-79832 filed on Mar. 26, 2008, the entire contents of which are incorporated herein by reference.

BACKGROUND

1. Field

Aspects in accordance with the present application relate to a latch circuit and an electronic device.

2. Description of the Related Art

Unlike a hard error, in which a specific portion of a circuit is permanently broken, a soft error is a temporary malfunction that occurs randomly in a semiconductor chip and enables reproduction of an operation. This is caused by a neutron ray of secondary cosmic rays or an alpha ray emanating from an LSI material into an LSI.

Soft errors in latch circuits or flip-flops of logic circuits are acknowledged as a problem. A general countermeasure against soft errors in latch circuits is to provide a latch circuit that retains data at a plurality of nodes (for example, Japanese Patent Application Laid-Open No. 2007-312104).

In recent years, however, as semiconductor chips progressively involve high-integration, the probability of noise due to nuclear radiation at two nodes in the latch circuit increases. When noise is generated at the two nodes in the latch circuit designed to retain data at a plurality of nodes, for example, correct data cannot be maintained. Even when noise is generated at a plurality of nodes at the time of calculating parities of plural latch circuits, the noise can be avoided (for example, Japanese Patent Application Laid-Open No. 2007-248378). However, the circuit design becomes very complicated, the area required for a parity arithmetic circuit becomes very large, and speed is greatly decreased.

SUMMARY

A latch circuit according to aspects of the present invention includes: at least four gates; three input terminals, wherein at least one output terminal is connected to at least one of the at least four gates; a feedback circuit, in which respective input terminals of the at least four gates are connected to output terminals of at least another two of the at least four gates; and a data inverting gate for outputting inverted data from the output terminals, when all data to be input into the three input terminals is the same, and for retaining previous data, when all the data to be input into the three input terminals is not the same.

Additional advantages and novel features of aspects of the present invention will be set forth in part in the description that follows, and in part will become more apparent to those skilled in the art upon examination of the following or upon learning by practice thereof.

BRIEF DESCRIPTION OF THE DRAWINGS

FIGS. 3A to 3D are circuit diagrams illustrating configuration examples of a data inverting gate;

FIG. 4 is a diagram illustrating a truth table of the data inverting gate of FIG. 3A;

FIG. 5 is a diagram illustrating a truth table of the data inverting gate of FIG. 3B;

DESCRIPTION OF THE PREFERRED EMBODIMENTS

First Embodiment

Figure 2:
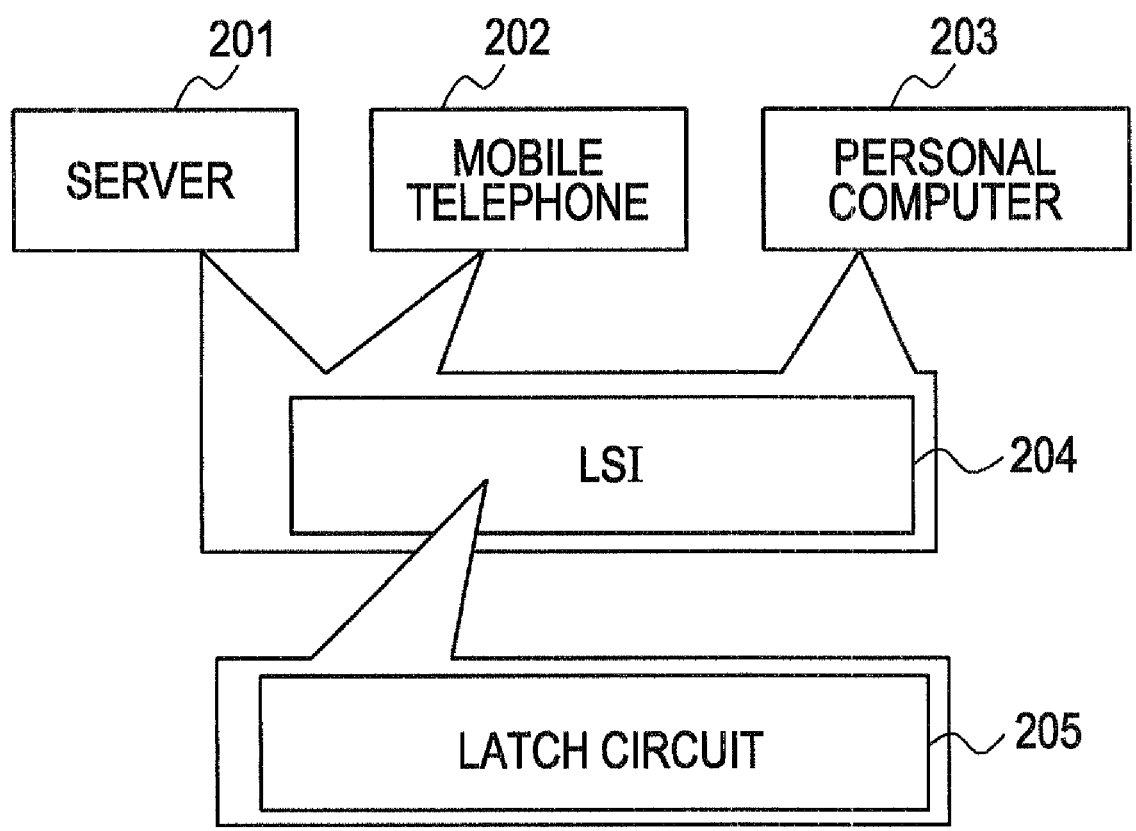
FIG. 2 is a diagram illustrating a configuration example of an electronic device having a latch circuit according to aspects of the first exemplary variation.

FIG. 2 is a diagram illustrating a configuration exemplary of an electronic device having a latch circuit according to aspects of a first exemplary variation of the present invention. Examples of the electronic device include, among others, a server 201, a mobile telephone 202 and a personal computer 203. The server 201, the mobile telephone 202 and the personal computer 203 have an LSI (Large-Scale Integration) 204. The LSI 204 includes a latch circuit 205.

Figure 1:
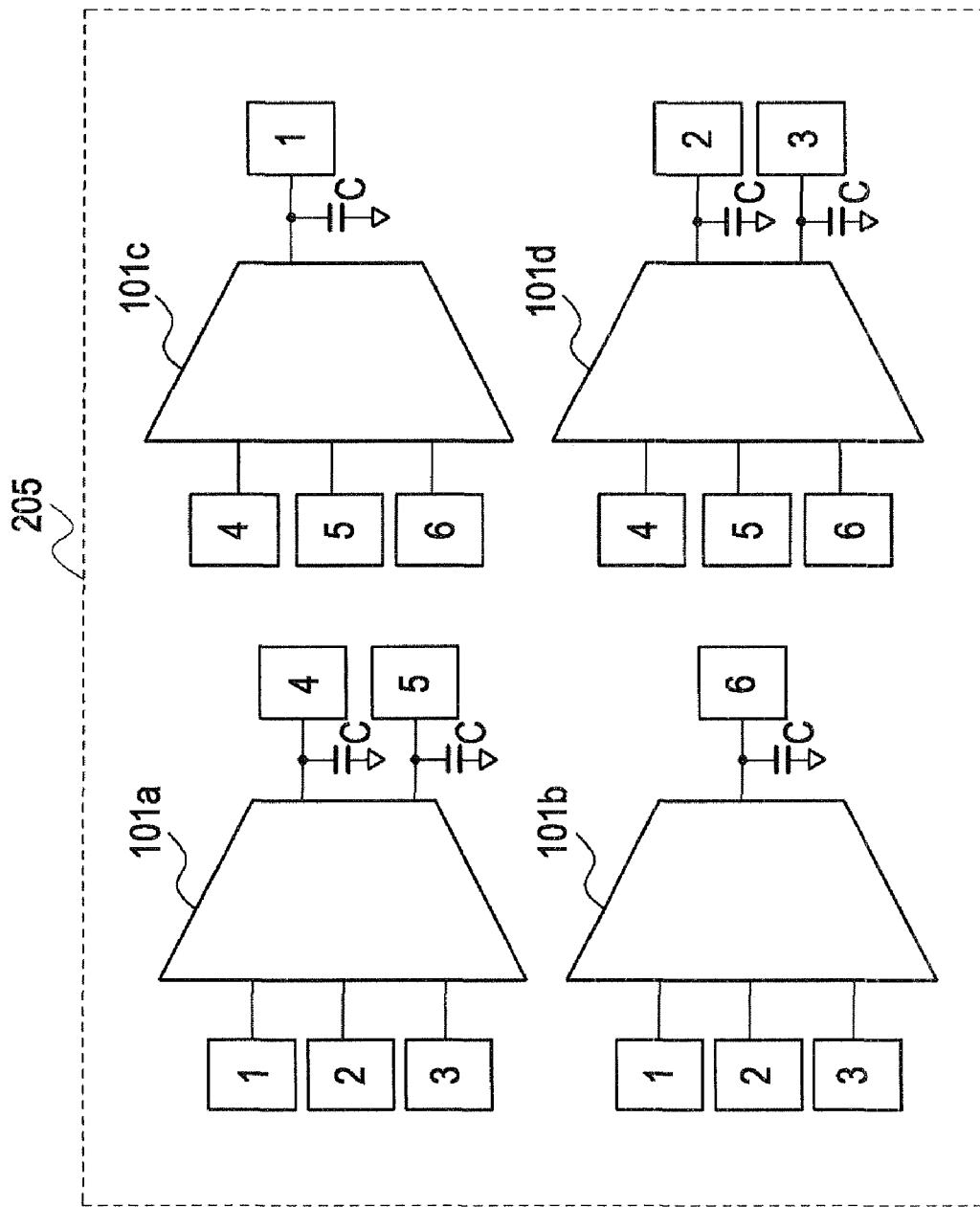
FIG. 1 is a diagram illustrating a configuration exemplary of a latch circuit according to aspects of a first exemplary variation.

FIG. 1 is a diagram illustrating a configuration exemplary of the latch circuit according to aspects of the first variation. The latch circuit 205 has four data inverting gates 101a, 101b, 101c and 101d. Three input terminals of the data inverting gate 101a are connected to a node 1, a node 2 and a node 3, respectively, and two output terminals are connected to a node 4 and a node 5, respectively. The output node 4 and the output node 5 are connected to a capacitor C. Three input terminals of the data inverting gate 101b are connected to a node 1, a node 2 and a node 3, respectively, and one output terminal is connected to a node 6. The output node 6 is connected to a capacitor C. Three input terminals of the data inverting gate 101c are connected to a node 4, a node 5 and a node 6, respectively, and one output terminal is connected to a node 1. The output node 1 is connected to a capacitor C. Three input terminals of the data inverting gate 101d are connected to a node 4, a node 5 and a node 6, respectively, and the two output terminals are connected to a node 2 and a node 3, respectively. The output node 2 and the output node 3 are connected to a capacitor C.

The nodes having the same numbers are connected to each other, in the example shown. The output terminal of the data inverting gate 101c is connected to the input terminals of the two data inverting gates 101a and 101b via the node 1. The two output terminals of the data inverting gate 101d are connected to the two input terminals of the two data inverting gates 101a and 101b via the node 2 and the node 3, respectively. The two output terminals of the data inverting gate 101a are connected to the two input terminals of the two data inverting gates 101c and 101d via the node 4 and the node 5, respectively. The output terminal of the data inverting gate 101b is connected to the input terminals of the two data inverting gates 101c and 101d via the node 6.

FIGS. 3A to 3D are circuit diagrams illustrating configuration examples of the data inverting gates 101a to 101d. An MOS field-effect transistor is simply called a transistor, in this illustrative example.

FIG. 3A is a circuit diagram illustrating the configuration example of the data inverting gates 101b and 101c with three inputs and one output. The data inverting gates 101b and 101c have three input terminals INA, INB and INC, one output terminal OUTA, three p-channel transistors 301 to 303, and three n-channel transistors 304 to 306.

A gate of the p-channel transistor 301 is connected to the input terminal INA, and a source thereof is connected to a power supply voltage node. A gate of the p-channel transistor 302 is connected to the input terminal INB, and a source thereof is connected to a drain of the p-channel transistor 301. A gate of the p-channel transistor 303 is connected to the input terminal INC, a source thereof is connected to a drain of the p-channel transistor 302, and a drain thereof is connected to the output terminal OUTA.

A gate of the n-channel transistor 304 is connected to the input terminal INC, and a drain thereof is connected to the output terminal OUTA. A gate of the n-channel transistor 305 is connected to the input terminal INB, and a drain thereof is connected to a source of the n-channel transistor 304. A gate of the n-channel transistor 306 is connected to the input terminal INA, a drain thereof is connected to a source of the n-channel transistor 305, and a source thereof is connected to a reference potential node (ground potential node).

The three input terminals INA, INB and INC of the data inverting gate 101b are connected to the node 1, the node 2 and the node 3 shown in FIG. 1, respectively, and the one output terminal OUTA is connected to the node 6 in FIG. 1. The three input terminals INA, INB and INC of the data inverting gate 101c are connected to the node 4, the node 5 and the node 6 in FIG. 1, and the output terminal OUTA is connected to the node 1 in FIG. 1. Truth tables of the data inverting gates 101a and 101c will be described later with reference to FIG. 4.

FIG. 3B is a circuit diagram illustrating the configuration example of the data inverting gates 101a and 101d, having three inputs and two outputs. The data inverting gates 101a and 101d each have three input terminals INA, INB and INC, the two output terminals OUTA and OUTB, three p-channel transistors 301 to 303 and three n-channel transistors 304 to 306. FIG. 3A is a circuit similar to FIG. 3A, with differences described below. The output terminal OUTA is connected to an intermediate point between a drain of the p-channel transistor 302 and a source of the p-channel transistor 303, and to an interconnecting point between a source of the n-channel transistor 304 and a drain of the n-channel transistor 305. The output terminal OUTB is connected to an interconnecting point between a drain of the p-channel transistor 303 and a drain of the n-channel transistor 304.

The three input terminals INA, INB and INC of the data inverting gate 101a are connected to the node 1, the node 2 and the node 3 in FIG. 1, respectively, and the two output terminals OUTA and OUTB are connected to the node 4 and the node 5 in FIG. 1, respectively. The three input terminals INA, INB and INC of the data inverting gate 101d are connected to the node 4, the node 5 and the node 6 in FIG. 1, respectively, and the two output terminals OUTA and OUTB are connected to the node 2 and the node 3 in FIG. 1, respectively. Truth tables of the data inverting gates 101a and 101d will be described later with reference to FIG. 5.

FIG. 3C is a circuit diagram illustrating another configuration example of the data inverting gates 101a and 101d having three inputs and two outputs. FIG. 3C is constituted similar to FIG. 3B, but including transistors 311 to 316 added to the data inverting gate in FIG. 3B. Additional differences in FIG. 3C from the data inverting gate in FIG. 3B will be described below.

The data inverting gates 101a and 101d have three input terminals INA, INB and INC, two output terminals OUTA and OUTB, and twelve transistors 301 to 306 and 311 to 316.

A gate of the p-channel transistor 311 is connected to the input terminal INA, and a source thereof is connected to a power supply voltage node. A gate of the p-channel transistor 312 is connected to the input terminal INB, and a source thereof is connected to a drain of the p-channel transistor 311. A gate of the p-channel transistor 313 is connected to the input terminal INC, and a source thereof is connected to a drain of the p-channel transistor 312.

A gate of the n-channel transistor 314 is connected to the input terminal INC, and a drain thereof is connected to a drain of the p-channel transistor 313. A gate of the n-channel transistor 315 is connected to the input terminal INB, and a drain thereof is connected to a source of the n-channel transistor 314. A gate of the n-channel transistor 316 is connected to the input terminal INA, a drain thereof is connected to a source of the n-channel transistor 315, and a source thereof is connected to a reference potential node (ground potential node).

The output terminal OUTA is connected to an interconnecting point between the drain of the p-channel transistor 303 and the drain of the n-channel transistor 304. The output terminal OUTB is connected to an interconnecting point between the drain of the p-channel transistor 313 and the drain of the n-channel transistor 314.

FIG. 3D is a circuit diagram illustrating another configuration example of the data inverting gates 101a and 101d having three inputs and two outputs. The data inverting gates 101a and 101d have three input terminals INA, INB and INC, two output terminals OUTA and OUTB, and three transistors 321 to 323.

A gate of the p-channel transistor 321 is connected to the input terminal INA, a source thereof is connected to the power supply voltage node, and a drain thereof is connected to the output terminal OUTA. A gate of the n-channel transistor 322 is connected to the input terminal INB, a drain thereof is connected to the output terminal OUTA, and a source thereof is connected to the output terminal OUTB. A gate of the n-channel transistor 323 is connected to the input terminal INC, a drain thereof is connected to the output terminal OUTB, and a source thereof is connected to the reference potential node.

FIG. 4 is a diagram illustrating the truth table of the data inverting gates 101b and 101c in FIG. 3A. For example, data "0" represents a low level, and data "1" represents a high level. When all the input terminals INA, INB and INC are "0", the transistors 301 to 303 are turned on, the transistors 304 to 306 are turned off, and the output terminal OUTA is "1". When all the input terminals INA, INB and INC are "1", the transistors 301 to 303 are turned off, the transistors 304 to 306 are turned on, and the output terminal OUTA is "0".

When the input terminals INA, INB and INC are "0", "0" and "1", respectively, the transistors 301, 302 and 304 are turned on, the transistors 303, 305 and 306 are turned off, and the output terminal OUTA is in a high-impedance state. Previous data stored in the capacitor C in FIG. 1 is retained. Similarly, when all input data of the input terminals INA, INB and INC is not the same, the output terminal OUTA is in a high-impedance state, and previous data stored in the capacitor C in FIG. 1 is retained.

When all the input data of the input terminals INA, INB and INC in the data inverting gates 101b and 103c is the same, the data inverting gates 101b and 101c output inverted data of the input data from the output terminal OUTA. When all the input data of the input terminals INA, INB and INC is not the same, the output terminal OUTA is in a high-impedance state, and previous data stored in the capacitor C in FIG. 1 is retained.

FIG. 5 is a diagram illustrating the truth table of the data inverting gates 101a and 101d in FIG. 3B. For example, data "0" represents a low level, data "1" represents a high level, and data "x" represents that the output terminals OUTA and OUTB are in a high-impedance state, and previous data stored in the capacitor C in FIG. 1 is retained. When all the input terminals INA, INB and INC are "0", the transistors 301 to 303 and 311 to 313 are turned on, the transistors 304 to 306 and 314 to 316 are turned off, and the output terminals OUTA and OUTB are "1". When all the input terminals INA, INB and INC are "1", the transistors 301 to 303 and 311 to 313 are turned off, the transistors 304 to 306 and 314 to 316 are turned on, and the output terminals OUTA and OUTB are "0".

When the input terminals INA, INB and INC are "0", "0" and "1", respectively, the output terminal OUTA is "1", and the output terminal OUTB is in a high-impedance state. As a result, previous data stored in the capacitor C in FIG. 1 is retained.

When the input terminals INA, INB and INC are "0", "1" and "0", when "0", "1" and "1", when "1", "0" and "0" or when "1", "0" and "1", respectively, the output terminal OUTA and the output terminal OUTB are in a high-impedance state. As a result, previous data stored in the capacitor C in FIG. 1 is retained.

When the input terminals INA, INB and INC are "1", "1" and "0", respectively, the output terminal OUTA is "0", and the output terminal OUTB is in a high-impedance state. As a result, previous data stored in the capacitor C in FIG. 1 is retained.

In the data inverting gates 101a and 101d, when all the input data of the input terminals INA, INB and INC is the same, inverted data of the input data is output from the output terminals OUTA and OUTB. When all the input data of the input terminals INA, INB and INC is not the same, at least one of the output terminals OUTA and OUTB is in a high-impedance state, and previous data stored in the capacitor C in FIG. 1 is retained.

Figure 6:
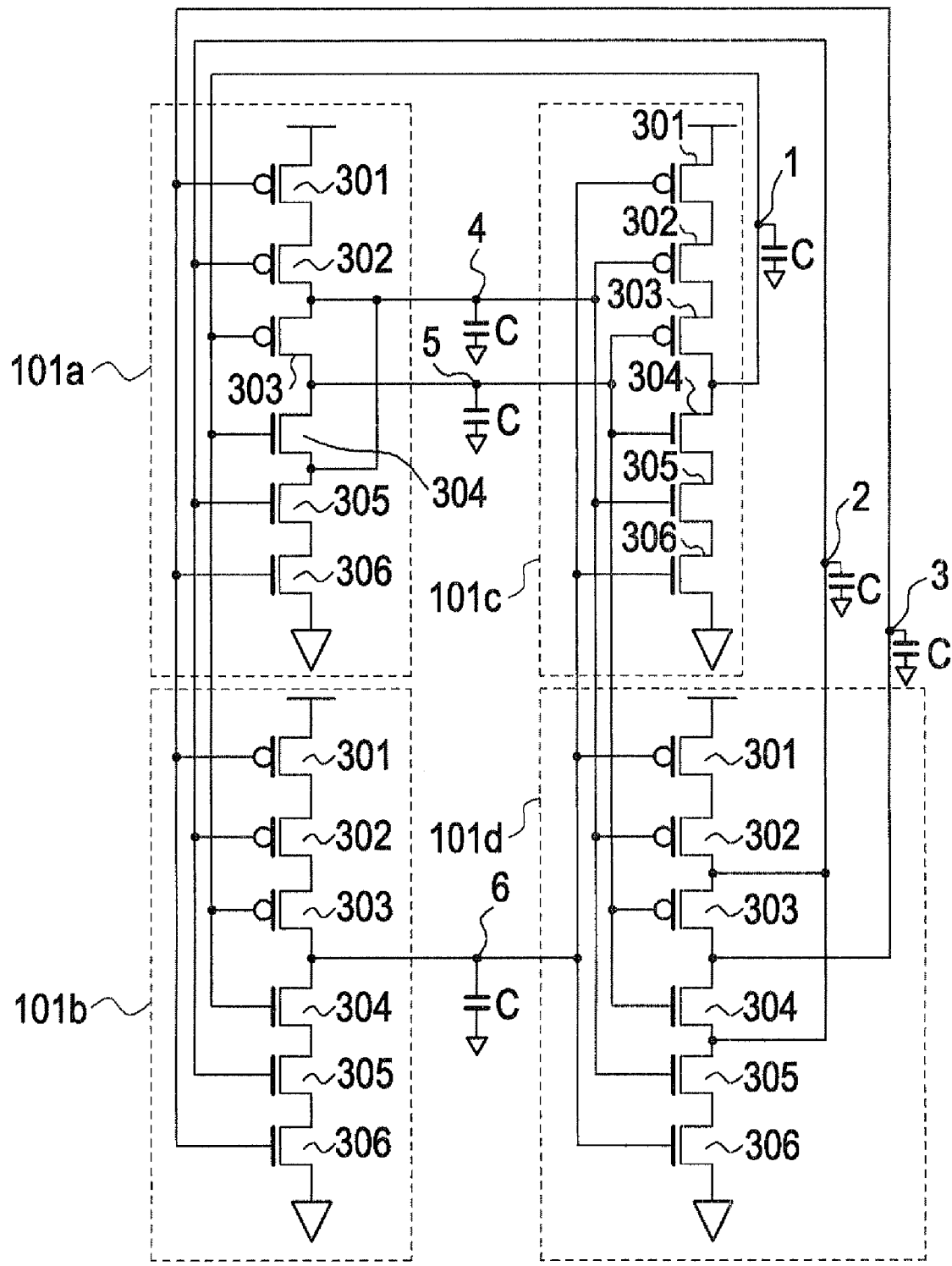
FIG. 6 is a circuit diagram illustrating a configuration exemplary of the latch circuit in FIG. 1.

FIG. 6 is a circuit diagram illustrating the configuration example of the latch circuit 205 in FIG. 1. The data inverting gates 11b and 11c have the circuit configuration in FIG. 3A. The data inverting gates 101a and 101d have the circuit configuration in FIG. 3B.

Figure 8:
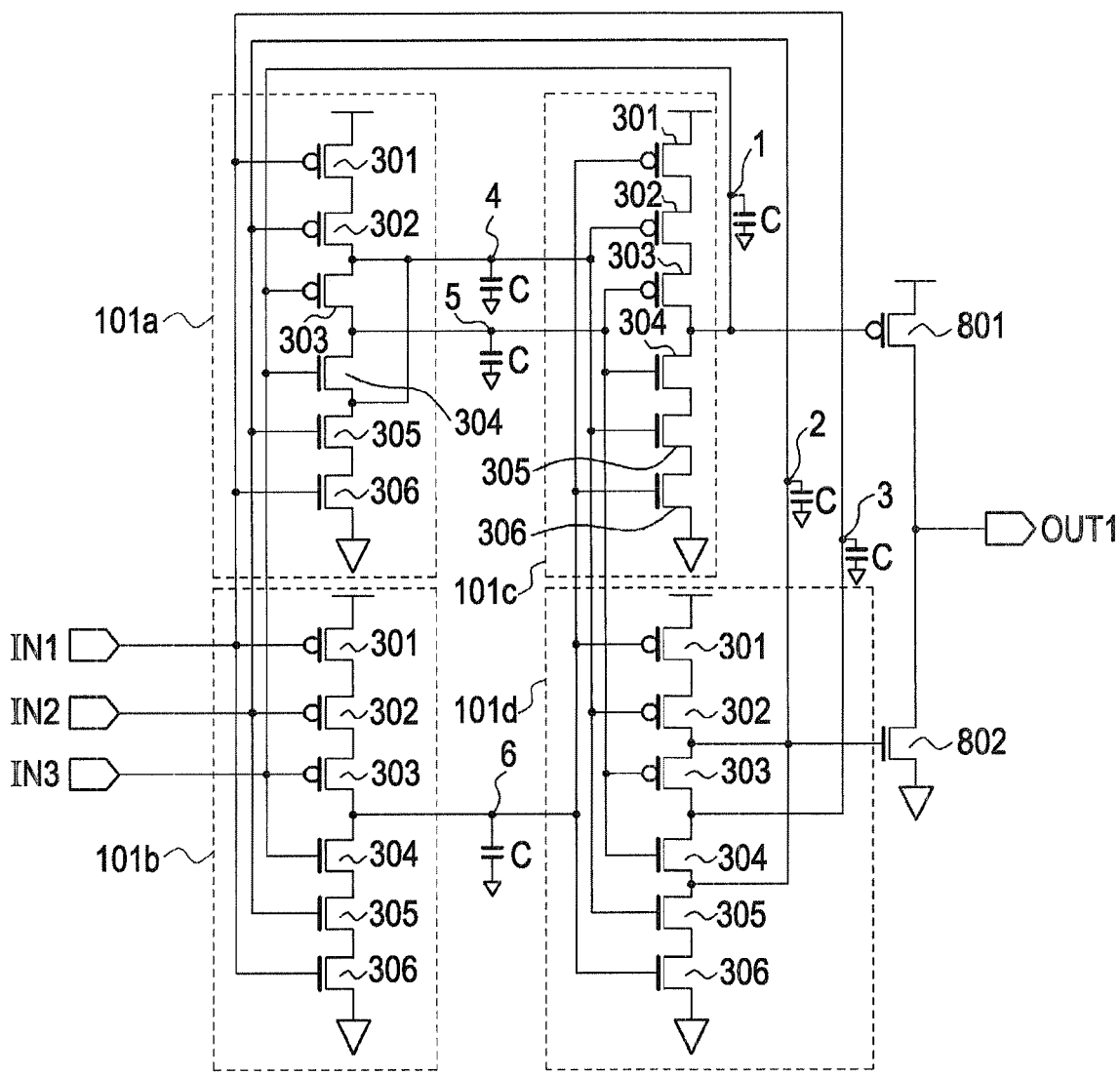
FIG. 8 is a circuit diagram illustrating a configuration exemplary of a latch circuit with three inputs and one output.

FIG. 8 is a circuit diagram illustrating a configuration example of the latch circuit with three inputs and one output. This latch circuit is constituted so that three input terminals IN1, IN2 and IN3, one output terminal OUT1 and two transistors 801 and 802 are added to the latch circuit in FIG. 6. The input terminal IN1 is connected to a node 3, the input terminal IN2 is connected to a node 2, and the input terminal IN3 is connected to a node 1. A gate of the p-channel transistor 801 is connected to the node 1, a source thereof is connected to a power supply voltage node, and a drain thereof is connected to the output terminal OUT1. A gate of the n-channel transistor 802 is connected to the node 2, a drain thereof is connected to the output terminal OUT1, and a source thereof is connected to a reference potential node.

When "0" is input into the three input terminals IN1 to IN3 and a soft error does not occur at the nodes 1 to 6, "0" is retained at the nodes 1 to 3, and "1" is retained at the nodes 4 to 6. As a result, the gate of the transistor 801 is "0", and the gate of the transistor 802 is also "0". As a result, the transistor 801 is turned on, the transistor 802 is turned off, and the output terminal OUT1 is "1".

When "1" is input into the three input terminals IN1 to IN3 and a soft error does not occur at the nodes 1 to 6, "1" is retained at the nodes 1 to 3, and "0" is retained at the nodes 4 to 6. As a result, the gate of the transistor 801 is "1", and the gate of the transistor 802 is also "1". As a result, the transistor 801 is turned off, the transistor 802 is turned on, and the output terminal OUT1 is "0".

As shown in the truth tables in FIGS. 4 and 5, even if two or less of the input data of the three input terminals INA to INC are inverted due to soft error, the output terminals OUTA and OUTB retain previous data. For this reason, the data inverting gates 101a to 101d can prevent the soft error.

Figure 9:
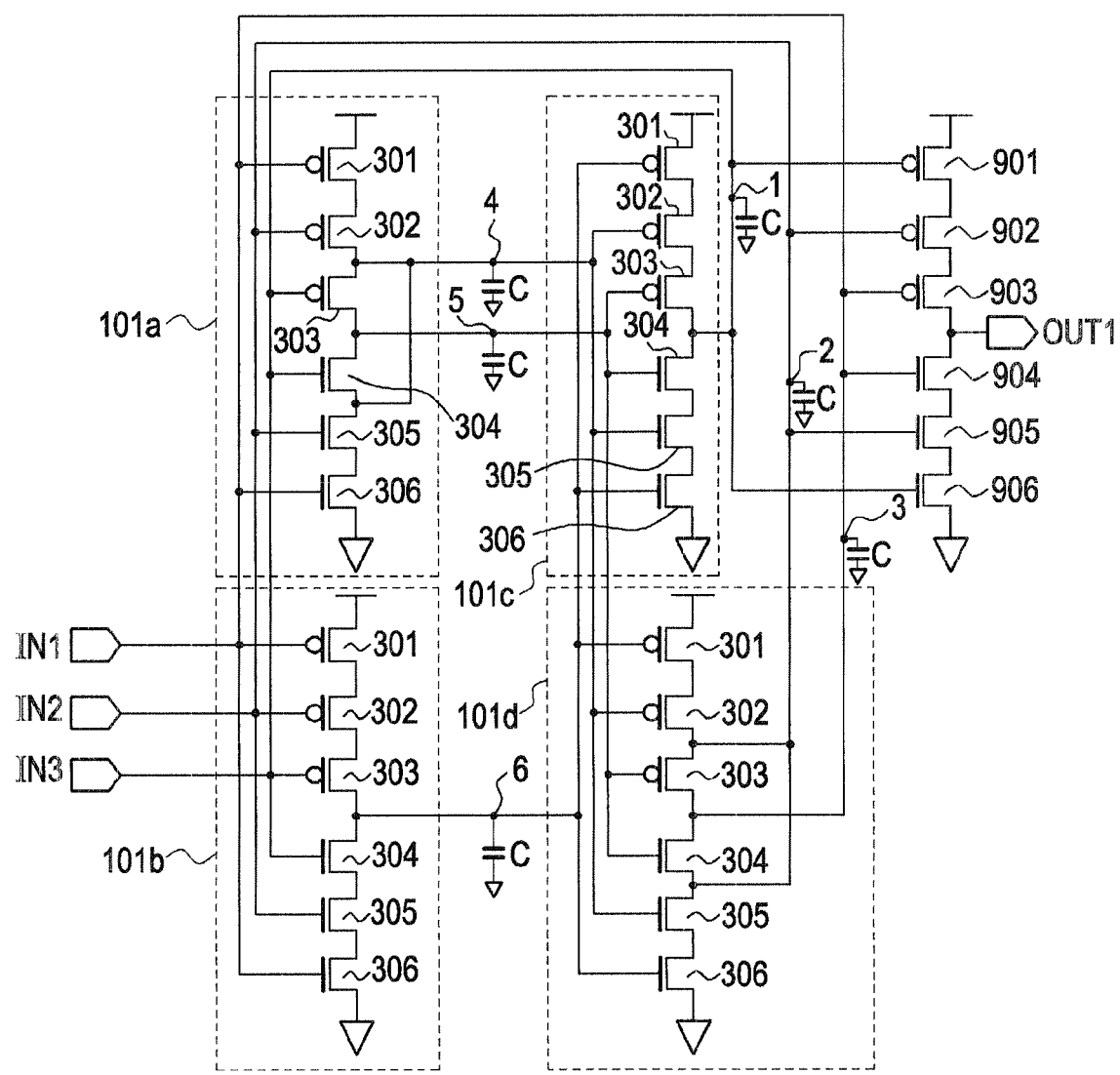
FIG. 9 is a circuit diagram illustrating a configuration exemplary of another latch circuit with three inputs and one output.

FIG. 9 is a circuit diagram illustrating a configuration example of another latch circuit with three inputs and one output. The latch circuit in FIG. 9 is constituted by providing transistors 901 to 906 to the latch circuit in FIG. 8 instead of the transistors 801 and 802. This latch circuit performs the same operation. A different point of the latch circuit in FIG. 9 from the latch circuit in FIG. 8 will be described below.

A gate of the p-channel transistor 901 is connected to the node 1, and a source thereof is connected to the power supply voltage node. A gate of the p-channel transistor 902 is connected to the node 2, and a source thereof is connected to a drain of the p-channel transistor 901. A gate of the p-channel transistor 903 is connected to the node 3, a source thereof is connected to a drain of the p-channel transistor 902, and a drain thereof is connected to the output terminal OUT1.

A gate of the n-channel transistor 904 is connected to the node 3, and a drain thereof is connected to the output terminal OUT1. A gate of the n-channel transistor 905 is connected to the node 2, and a drain thereof is connected to a source of the n-channel transistor 904. A gate of the n-channel transistor 906 is connected to the node 1, a drain thereof is connected to a source of the n-channel transistor 905, and a source thereof is connected to the reference potential node.

Figure 10:
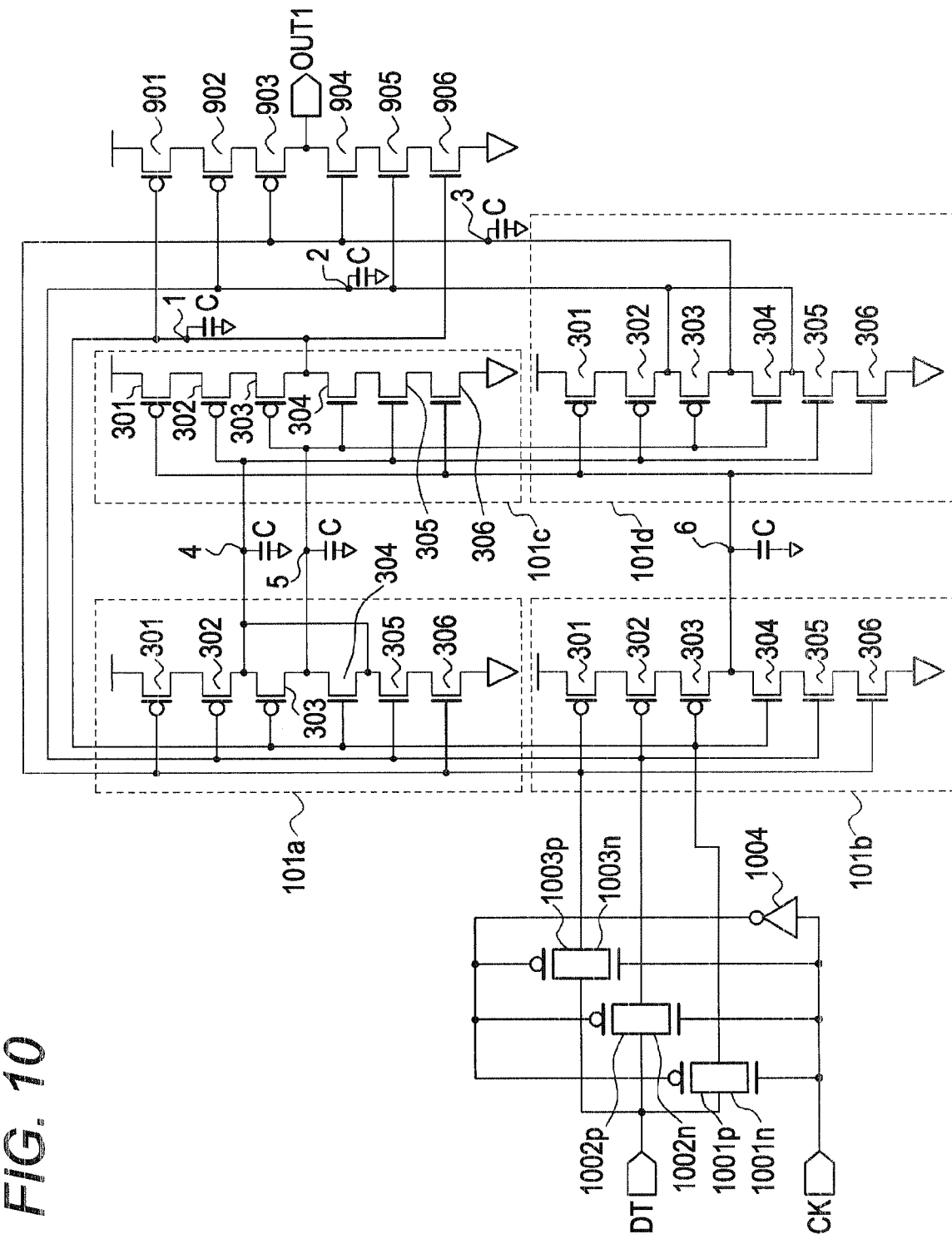
FIG. 10 is a circuit diagram illustrating a configuration exemplary of a latch circuit having a data terminal and a clock terminal.

FIG. 10 is a circuit diagram illustrating a configuration example of a latch circuit with a data terminal and a clock terminal. The latch circuit in FIG. is constituted by adding a data terminal DT, a clock terminal CK, transistors 1001n, 1001p, 1002n, 1002p, 1003n and 1003p, and an inverter 1004 to the latch circuit in FIG. 9.

The data terminal DT is for inputting data, and the clock terminal CK is for inputting a clock signal. The inverter 1004 inverts the clock signal of the clock terminal CK so as to output it.

A gate of the n-channel transistor 1001n is connected to the clock terminal K, a source and a drain thereof are connected to the data terminal DT and the node 1, respectively. A gate of the p-channel transistor 1001p is connected to an output terminal of the inverter 1004, and a source and a drain thereof are connected to the data terminal DT and the node 1, respectively.

A gate of the n-channel transistor 1002n is connected to the clock terminal CK, and a source and a drain thereof are connected to the data terminal DT and the node 2, respectively. A gate of the p-channel transistor 1002p is connected to the output terminal of the inverter 1004, and a source and a drain thereof are connected to the data terminal DT and the node 2, respectively.

A gate of the n-channel transistor 1003*n* is connected to the clock terminal CK, and a source and a drain thereof are connected to the data terminal DT and the node 3, respectively. A gate of the p-channel transistor 1003*p* is connected to the output terminal of the inverter 1004, and a source and a drain thereof are connected to the data terminal DT and the node 3.

When a clock signal at the clock terminal CK is at a high level, the transistors 1001*n*, 1001*p*, 1002*n*, 1002*p*, 1003*n* and 1003*p* are turned on, and data at the data terminal DT is input into the nodes 1 to 3. The nodes 1 to 3 are rewritten by the data of the data terminal DT. This state is a data writing mode.

On the contrary, when the clock signal at the clock terminal CK is at a low level, the transistors 1001*n*, 1001*p*, 1002*n*, 1002*p*, 1003*n* and 1003*p* are turned off, and the data terminal DT is disconnected from the nodes 1 to 3. The nodes 1 to 3 retain previous data. This state is a data retaining mode.

At the data writing mode, the same data of the data terminal DT are written into the nodes 1 to 3. When the data at the nodes 1 to 3 are the same, the output terminal OUT1 outputs inverted data of the data of the data terminal DT.

As shown in the truth tables in FIGS. 4 and 5, even when the data inverting gates 101*a* to 101*d* invert two or less of the input data from the three input terminals INA to INC due to a soft error, the output terminals OUTA and OUTB retain previous data. For this reason, the soft error can be prevented.

More specifically, even when two or less of the three nodes 1 to 3 invert data simultaneously due to a soft error, the output terminals OUTA and OUTB retain previous data, thereby preventing the soft error. Even when the two or less of the three nodes 4 to 6 invert data simultaneously due to soft error, the output terminals OUTA and OUTB retain previous data, thereby preventing the soft error.

Figure 11:
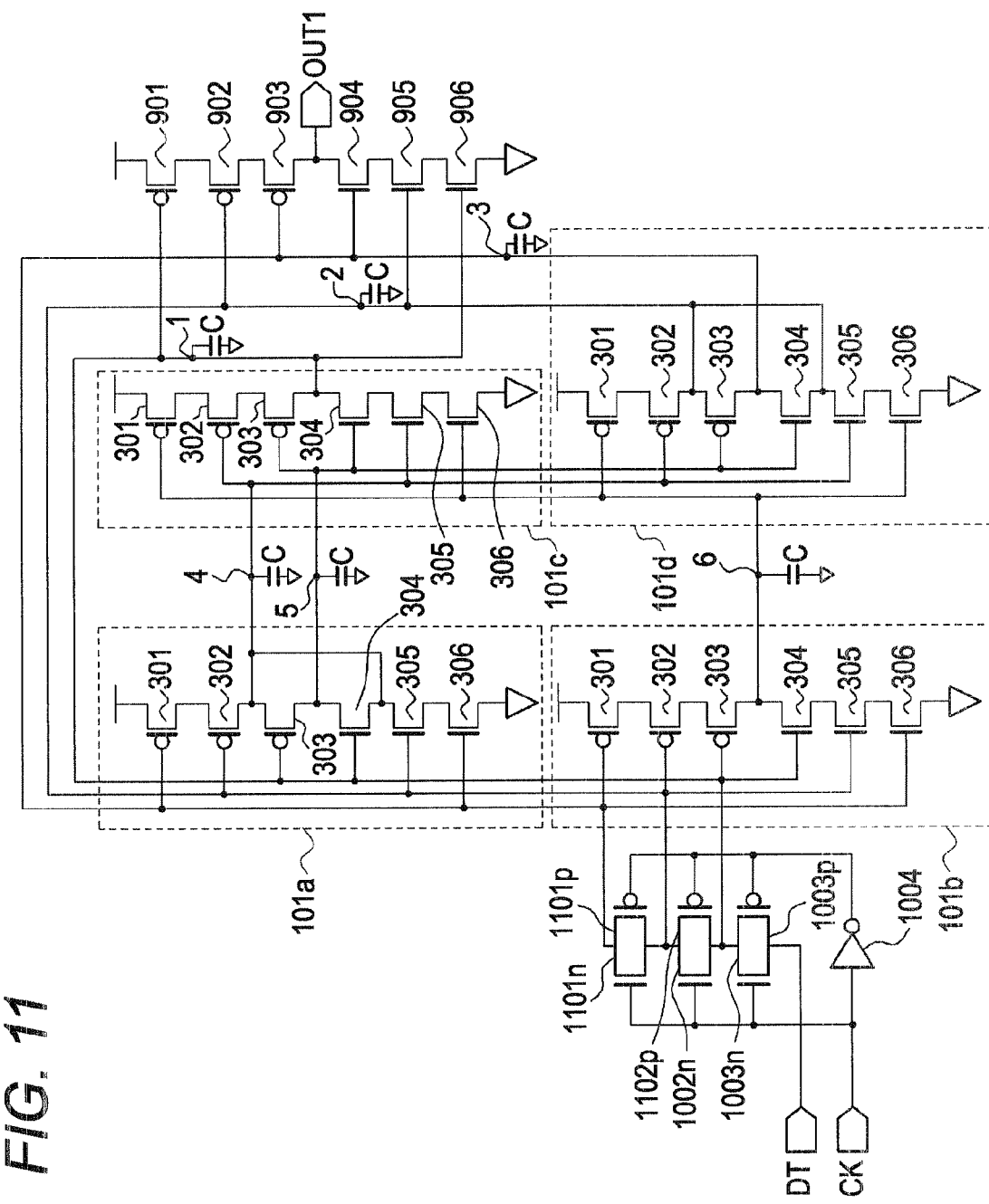
FIG. 11 is a circuit diagram illustrating a configuration exemplary of another latch circuit having a data terminal and a clock terminal.

FIG. 11 is a circuit diagram illustrating a configuration example of another latch circuit having a data terminal and a clock terminal. The latch circuit in FIG. 11 is constituted by providing transistors 1101*n*, 1101*p*, 1102*n*, 1102*p*, 1103*n* and 1103*p* to the latch circuit in FIG. 10 instead of the transistors 1001*n*, 1001*p*, 1002*n*, 1002*p*, 1003*n* and 1003*p*. The circuit in FIG. 11 performs a similar operation. The different points of the latch circuit in FIG. 11 from the latch circuit in FIG. 10 will be described below.

A gate of the n-channel transistor 1103*n* is connected to the clock terminal CK, and a source and a drain thereof are connected to the data terminal DT and the node 1, respectively. A gate of the p-channel transistor 1103*p* is connected to the output terminal of the inverter 1004, and a source and a drain thereof are connected to the data terminal DT and the node 1, respectively.

A gate of the n-channel transistor 1102*n* is connected to the clock terminal CK, and a source and a drain thereof are connected to the node 1 and the node 2, respectively. A gate of the p-channel transistor 1102*p* is connected to the output terminal of the inverter 1004, and a source and a drain thereof are connected to the node 1 and the node 2 respectively.

A gate of the n-channel transistor 1101*n* is connected to the clock terminal CK, and a source and a drain thereof are connected to the node 2 and the node 3, respectively. A gate of the p-channel transistor 1101*p* is connected to the output terminal of the inverter 1004, and a source and a drain thereof are connected to the node 2 and the node 3, respectively.

When a clock signal at the clock terminal CK is at a high level, the transistors 1101*n*, 1101*p*, 1102*n*, 1102*p*, 1103*n* and 1103*p* are turned on, and data at the data terminal DT is input into the nodes 1 to 3. The nodes 1 to 3 are rewritten by the data of the data terminal DT.

On the contrary, when the clock signal at the clock terminal CK is at a low level, the transistors 1101*n*, 1101*p*, 1102*n*, 1102*p*, 1103*n* and 1103*p* are turned off, and the data terminal DT is disconnected from the nodes 1 to 3. The nodes 1 to 3 retain previous data.

Second Exemplary Variation

Figure 7:
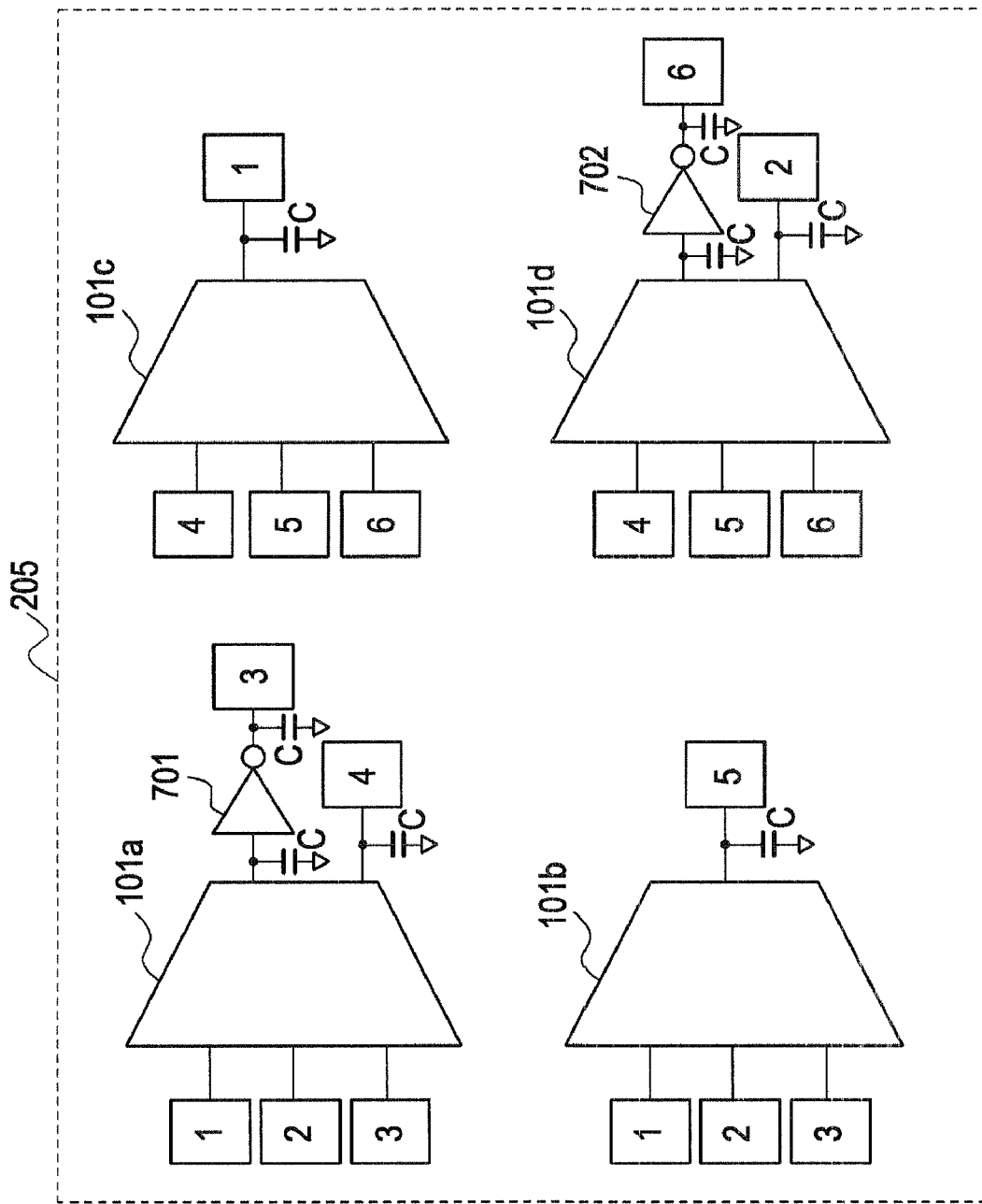
FIG. 7 is a diagram illustrating a configuration exemplary of a latch circuit according to aspects of a second exemplary variation.

FIG. 7 is a diagram illustrating a configuration example of the latch circuit according to aspects of a second exemplary variation of the present invention. The different points of the latch circuit in FIG. 7 from the latch circuit in FIG. 1 will be described below. The latch circuit 205 has the four data inverting gates 101*a*, 101*b*, 101*c* and 101*d*. Three input terminals of the data inverting gate 101*a* are connected to the node, 1, the node 2 and the node 3, and two output terminals thereof are connected to an input terminal of an inverter 701 and the node 4. The inverter 701 inverts input data from the input terminal so as to output it from an output terminal. The output terminal of the inverter 701 is connected to the node 3. The input terminal of the inverter 701, the node 3 and the node 4 are connected to the capacitor C. Three input terminals of the data inverting gate 101*b* are connected to the node 1, the node 2 and the node 3, and one output terminal thereof is connected to the node 5. The node 5 is connected to the capacitor C. Three input terminals of the data inverting gate 101*c* are connected to the node 4, the node 5 and the node 6, and one output terminal thereof is connected to the node 1. The node 1 is connected to the capacitor C. Three input terminals of the data inverting gate 101*d* are connected to the node 4, the node 5 and the node 6, and two output terminals thereof are connected to an input terminal of the inverter 702 and the node 2. The inverter 702 inverts the input data from the input terminal so as to output it from an output terminal. The output terminal of the inverter 702 is connected to the node 6. The input terminal of the inverter 702, the node 2 and the node 6 are connected to the capacitor C.

The nodes having the same numbers are connected to each other. The output terminal of the data inverting gate 101*c* is connected to the input terminals of the two data inverting gates 101*a* and 101*b* via the node 1. The two output terminals of the data inverting gate 101*d* are connected to the input terminals of the two data inverting gates 101*a* and 101*b* via the node 2. The output terminal of the inverter 701 is connected to the input terminals of the two data inverting gates 101*a* and 101*b* via the node 3. The output terminal of the data inverting gate 101*a* is connected to the input terminals of the two data inverting gates 101*c* and 101*d* via the node 4. The output terminal of the data inverting gate 101*b* is connected to the input terminals of the two data inverting gates 101*c* and 101*d* via the node 5. The output terminal of the inverter 702 is connected to the input terminals of the two data inverting gates 101*c* and 101*d* via the node 6.

The configurations of the data inverting gates 10.*a* to 101*d* are the same as those in the first exemplary variation. Similarly to the first variation, as shown in the truth tables in FIGS. 4 and 5, even when the data inverting gates 101*a* to 101*d* invert two or less data in the input data from the three input terminals INA to INC due to soft error, the output terminals OUTA and OUTB retain previous data. As a result, the soft error can be prevented.

Third Exemplary Variation

Figure 12A:
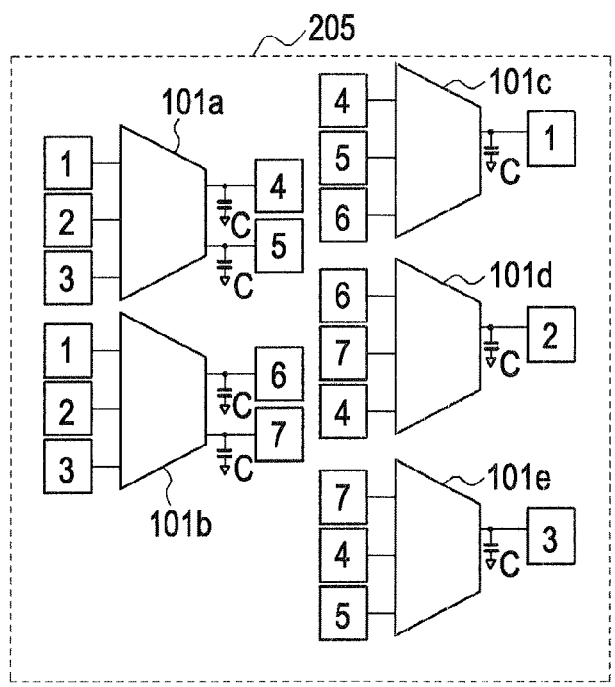
FIGS. 12A to 12C are diagrams illustrating configurations exemplary of a latch circuit according to aspects of a third exemplary variation.
Figure 12B:
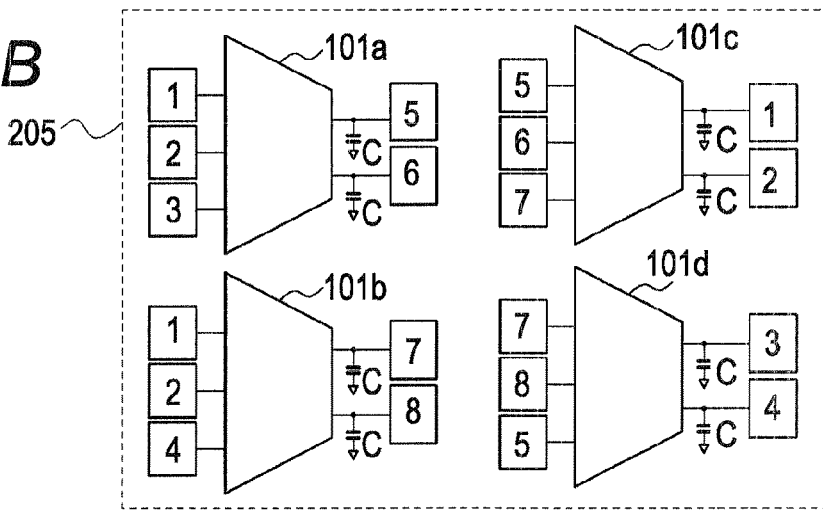
Figure 12C:
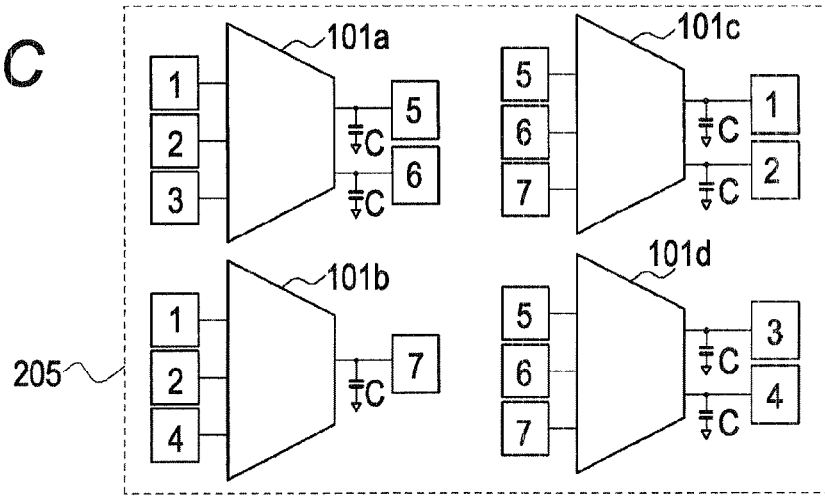

FIGS. 12A to 12C are diagrams illustrating configurations exemplary of the latch circuit according to aspects of a third exemplary variation of the present invention. The different points of the third variation from the first variation will be described below.

First, a latch circuit 205 in FIG. 12A will be described. The latch circuit 205 has five data inverting gates 101*a*, 101*b*, 101*c*, 101*d* and 101*e*. Three input terminals of the data inverting gate 101*a* are connected to the node 1, the node 2 and the node 3, and two output terminals thereof are connected to the node 4 and the node 5. The output node 4 and the output node 5 are connected to the capacitor C. Three input terminals of the data inverting gate 101*b* are connected to the node 1, the node 2 and the node 3, and two output terminals thereof are connected to the node 6 and a node 7. The output node 6 and the output node 7 are connected to the capacitor C. Three input terminals of the data inverting gate 101*c* are connected to the node 4, the node 5 and the node 6, and one output terminal thereof is connected to the node 1. The output node 1 is connected to the capacitor C. Three input terminals of the data inverting gate 101*d* are connected to the node 6, the node 7 and the node 4, and one output terminal thereof is connected to the node 2. The output node 2 is connected to the capacitor C. Three input terminals of the data inverting gate 101*e* are connected to the node 7, the node 4 and the node 5, and one output terminal thereof is connected to the node 3. The output node 3 is connected to the capacitor C. The nodes having the same numbers are connected to each other. The data inverting gates 101*a* and 101*b* with three inputs and two outputs have the circuit configurations shown in FIGS. 3B to 3D. The data inverting gates 101*c*, 101.*d* and 101*e* with three inputs and one output have the circuit configuration shown in FIG. 3A. The same data is input from outside into the nodes 1 to 3.

The latch circuit 205 in FIG. 12B will be described below. The latch circuit 205 has the four data inverting gates 101*a*, 101*b*, 101*c* and 101*d*. The three input terminals of the data inverting gate 101*a* are connected to the node 1, the node 2 and the node 3, and the two output terminals thereof are connected to the node 5 and the node 6. The output node 5 and the output node 6 are connected to the capacitor C. The three input terminals of the data inverting gate 101*b* are connected to the node 1, the node 2 and the node 4, and the two output terminals thereof are connected to the node 7 and a node 8. The output node 7 and the output node 8 are connected to the capacitor C. The three input terminals of the data inverting gate 101*c* are connected to the node 5, the node 6 and the node 7, and the two output terminals thereof are connected to the node and the node 2. The output node 1 and the output node 2 are connected to the capacitor C. The three input terminals of the data inverting gate 101*d* are connected to the node 7, the node 8 and the node 5, and the two output terminals thereof are connected to the node 3 and the node 4. The output node 3 and the output node 4 are connected to the capacitor C. The nodes having the same numbers are connected to each other. The data inverting gates 101*a* to 101*d* with three inputs and two outputs have the circuit configurations shown in FIGS. 3B to 3D. The same data is input from outside into the nodes 1 to 4.

Next, the latch circuit 205 in FIG. 12C will be described below. The latch circuit 205 has four data inverting gates 101*a*, 101*b*, 101*c* and 101*d*. The three input terminals of the data inverting gate 101*a* are connected to the node 1, the node 2 and the node 3, and the two output terminals thereof are connected to the node 5 and the node 6. The output node 5 and the output node 6 are connected to the capacitor C. The three input terminals of the data inverting gate 101*b* are connected to the node 1, the node 2 and the node 4, and the one output terminal thereof is connected to the node 7. The output node 7 is connected to the capacitor C. The three input terminals of the data inverting gate 101*c* are connected to the node 5, the node 6 and the node 7, and the two output terminals thereof are connected to the node 1 and the node 2. The output node 1 and the output node 2 are connected to the capacitor C. The three input terminals of the data inverting gate 101*d* are connected to the node 5, the node 6 and the node 7, and the two output terminals thereof are connected to the node 3 and the node 4. The output node 3 and the output node 4 are connected to the capacitor C. The nodes having the same numbers are connected to each other. The data inverting gates 101*a*, 101*c* and 101*d* with three inputs and two outputs have the circuit configurations shown in FIGS. 3B to 3D. The data inverting gate 101*b* with three inputs and one output has the circuit configuration shown in FIG. 3A. The same data are input from outside into the nodes 1 to 4.

According to aspects of the first to third variations, in the data writing mode, the same data at the data terminal DT is written into the plurality of input terminals of the respective data inverting gates. When all the input data is the same, the data inverting gates output inverted data of the input data as described above.

As shown in the truth tables in FIGS. 4 and 5, even when data from two of the three input terminals INA to INC is inverted due to soft error, the output terminals OUTA and OUTB retain previous data, and thus the data inverting gates can prevent the soft error.

That is to say, even when two of the three nodes of the input terminals INA to INC invert data simultaneously due to soft error, the output terminals OUTA and OUTB retain previous data. For this reason, the soft error can be prevented.

When attention is paid to one data inverting gate, the data inverting gate has three input terminals INA to INC. Even when an error signal is input into two of the input terminals INA to INC, as shown in FIGS. 4 and 5, the output terminals OUTA and OUTB are not influenced by the error signal. Therefore, as shown in FIG. 6, the data inverting gates are connected, so that even if an error occurs on any two nodes, the data inverting gates can prevent noise due to the error. Therefore, the latch circuit is strongly resistant to soft error, and thus electronic devices having such a latch circuit are very resistance to soft error.

Since soft error can be prevented without calculating parities, the area of a parity arithmetic circuit does not need to be increased, thereby preventing a reduction in speed of the parity arithmetic that would be caused by such an increase.

The latch circuit and the electronic devices having the latch circuit in the above exemplary variations can maintain an ideal speed, prevent soft errors, and improve reliability.

The capacitor C may be parasitic capacitor, and may be, for example, wiring capacitor and/or gate capacitor of transistors.

The latch circuit in the first to third exemplary variations has four or more gates. A generic term for data inverting gates 101*a* to 101*e* is data inverting gate 101. The four or more gates are the data inverting gate 101 or the inverters 701 and 702. At least one of the four or more gates has three input terminals INA to INC and one or two output terminals OUTA and OUTB. When all the data to be input into the three input terminals is the same, inverted data is output from the output terminals. When all the data to be input into the three input terminals is not the same, the data inverting gate 101 retains previous data. When the input terminals of at least one of the four or more gates are connected to the output terminals of at least one of the other gates, the four or more gates constitute a feedback circuit.

The capacitor C is a data retaining section which is connected to the output terminal of the data inverting gate 101 and retains data at the output terminal. When all the data to be input into the three input terminals is not the same, the data inverting gate 101 brings at least one output terminal into a high-impedance state and retains previous data retained in the data retaining section C.

As shown in FIGS. 1, 7 and 12A to 12C, at least four of the four or more gates are the data inverting gate 101.

In FIGS. 1, 7, and 12A to 12C, one of the at least four data inverting gates has three input terminals and two output terminals, and another one of the at least four data inverting gates has three input terminals and one output terminal.

In FIG. 12B, the at least four data inverting gates have three input terminals and two output terminals.

As shown in FIGS. 3A to 3D, the respective data inverting gates 101 have three or more field-effect transistors whose gates are connected to the three input terminals INA to INC and which are connected to each other in series.

In FIGS. 3A to 3C, the data inverting gates 101 have the three p-channel field-effect transistors 301 to 303 and the three n-channel field-effect transistors 304 to 306 whose gates are connected to the three input terminals INA to INC and which are connected to each other in series.

In FIG. 3A, the three p-channel field-effect transistors 301 to 303 are first to third p-channel field-effect transistors, and the three n-channel field-effect transistors 304 to 306 are first to third n-channel field-effect transistors. The data inverting gate 101 has one output terminal OUTA, and the one output terminal OUTA is connected to an interconnecting point between the drain of the third p-channel field-effect transistor 303 and the drain of the first n-channel field-effect transistor 304.

In FIG. 3B, the three p-channel field-effect transistors 301 to 303 are first to third p-channel field-effect transistors, and the three n-channel field-effect transistors 304 to 306 are first to third n-channel field-effect transistors. The data inverting gate 101 has the first and second output terminals OUTA and OUTB, and the first output terminal OUTA is connected to an interconnecting point between the second and third p-channel field-effect transistors 302 and 303, and to an interconnecting point between the first and second n-channel field-effect transistors 304 and 305. The second output terminal OUTB is connected to an interconnecting point between the drain of the third p-channel field-effect transistor 303 and the drain of the first n-channel field-effect transistor 304.

As shown in FIGS. 10 and 11, the same data of the data terminal DT is input into the three input terminals INA to INC of the data inverting gate 101 from the outside. The transistors 1001n, 1001p, 1002n, 1002p, 1003n, 1003p, 1101n, 1101p, 1102n, 1102p, 1103n and 1103p are switches for inputting the same data of the data terminal DT into the three input terminals INA to INC of the data inverting gate 101 according to a clock signal of the clock terminal CK.

As shown in FIGS. 8 to 11, the transistors 801, 802 and 901 to 906 are a plurality of output field-effect transistors whose gates are connected to output terminals of two of the four or more gates, and which are connected to each other in series and output data.

Since the data inverting gate has three input terminals, even if data is inverted at one or two of the three input terminals due to soft error, the data inverting gate can retain previous data. As a result, the data inverting gate as the latch circuit can prevent the soft error, so that reliability can be improved. Since a parity arithmetic circuit is not necessary for preventing soft error, the area of the parity arithmetic circuit does not need to be increased, so that a reduction in speed due to the parity arithmetic can be prevented.

The above exemplary variations describe only concrete examples for carrying out the invention, and thus the technical scope of the present invention should not be considered in a restrictive way. It will be appreciated that these examples are merely illustrative of aspects of the present invention. That is, the present invention can be embodied in various forms without departing from the spirit or essential characteristics thereof. Many variations and modifications will be apparent to those skilled in the art.

What is claimed is:

1. A latch circuit comprising:
   at least four gates;
   three input terminals and at least one output terminal which are connected to at least one of the at least four gates;
   at least six nodes, wherein each of the nodes is connected to an input terminal for at least two gates and to an output terminal for at least one gate;
   a feedback circuit in which respective input terminals of the at least four gates are connected to output terminals of at least another two of the at least four gates; and
   a data inverting gate connected to the output terminal,
   wherein the data inverting gate inverts data received from the output terminal and outputs the inverted data when input data into the three input terminals are the same, and
   wherein the data inverting gate retains previous data when the input data into the three terminals are not the same.

2. The latch circuit according to claim 1, further comprising:
   a data retaining section connected to an output terminal of the data inverting gate for retaining data at the output terminal,
   wherein when the data input into the three input terminals is not the same, the data inverting gate brings at least one output terminal into a high-impedance state, and retains previous data retained by the data retaining section.

3. The latch circuit according to claim 1, wherein four of the at least four gates are data inverting gates.

4. The latch circuit according to claim 1, wherein the data inverting gate has three input terminals and two output terminals.

5. The latch circuit according to claim 3, wherein at least one of the four data inverting gates has three input terminals and two output terminals, and another of the four data inverting gates has three input terminals and one output terminal.

6. The latch circuit according to claim 3, wherein the four data inverting gates have three input terminals and two output terminals.

7. The latch circuit according to claim 1, wherein the data inverting gate has at least three field-effect transistors whose gates are connected to the three input terminals, respectively, and which are connected to each other in series.

8. The latch circuit according to claim 1, wherein the data inverting gate has three p-channel field-effect transistors and three n-channel field-effect transistors whose gates are connected to the three input terminals, respectively, and which are connected to each other in series.

9. The latch circuit according to claim 8, wherein the three p-channel field-effect transistors are first to third p-channel field-effect transistors, and the three n-channel field-effect transistors are first to third n-channel field-effect transistors, and
the data inverting gate has one output terminal, and the one output terminal is connected to an interconnecting point between a drain of the third p-channel field-effect transistor and a drain of the first n-channel field-effect transistor.

10. The latch circuit according to claim 8, wherein
the three p-channel field-effect transistors are first to third p-channel field-effect transistors, and the three n-channel field-effect transistors are first to third n-channel field-effect transistors, and
the data inverting gate has first and second output terminals, the first output terminal is connected to an interconnecting point between the second and third p-channel field-effect transistors and to an interconnecting point between the first and second n-channel field-effect transistors, and the second output terminal is connected to an interconnecting point between a drain of the third p-channel field-effect transistor and a drain of the first n-channel field-effect transistor.

11. The latch circuit according to claim 1, wherein
the same data is input into the three input terminals of the data inverting gate from the outside.

12. The latch circuit according to claim 1, further comprising:
a plurality of output field-effect transistors for outputting data whose gates are connected to output terminals of two of the at least four gates, and which are connected to each other in series.

13. The latch circuit according to claim 11, further comprising:
a switch which inputs the same data into the three input terminals of the data inverting gate according to a clock signal.

14. An electronic device comprising:
a latch circuit,
wherein the latch circuit includes:
at least four gates;
three input terminals and at least one output terminals that are connected to at least one of the at least four gates;
at least six nodes, wherein each of the nodes is connected to an input terminal for at least two gates and to an output terminal for at least one gate;
a feedback circuit in which respective input terminals of the at least four gates are connected to output terminals of at least another two of the at least four gates; and
a data inverting gate connected to the output terminal,
wherein the data inverting gate inverts data received from the output terminal and outputs the inverted data when input data into the three input terminals are the same, and
wherein the data inverting gate retains previous data, when the input data into the three input terminals are not the same.

* * * * *